United States Patent [19]

Schellin

[11] 4,352,785
[45] Oct. 5, 1982

[54] CRYSTAL GROWER WITH TORQUE SUPPORTIVE COLLAPSIBLE PULLING MECHANISM

[75] Inventor: Winfrid O. E. Schellin, Emmaus, Pa.

[73] Assignee: Western Electric Co., Inc., New York, N.Y.

[21] Appl. No.: 337,050

[22] Filed: Jan. 4, 1982

[51] Int. Cl.³ .............................................. C30B 15/32
[52] U.S. Cl. ............................ 422/249; 156/DIG. 98
[58] Field of Search ................. 156/617 SP, DIG. 98, 156/618, 622, 624; 65/188; 422/249

[56] References Cited

U.S. PATENT DOCUMENTS

| | | | |
|---|---|---|---|
| 1,020,858 | 3/1912 | Tuite | 65/188 |
| 2,727,840 | 12/1955 | Teal | 156/617 SP |
| 2,753,280 | 7/1956 | Moore | 156/617 SP |
| 2,889,240 | 6/1959 | Rosi | 422/249 |
| 3,499,736 | 3/1970 | Zwanenburg | 156/601 |
| 3,679,370 | 7/1972 | Czeck et al. | 422/249 |
| 4,301,120 | 11/1981 | Sibley | 422/249 |

Primary Examiner—Hiram Bernstein
Attorney, Agent, or Firm—W. O. Schellin

[57] ABSTRACT

A Czochralski-type crystal growing apparatus (10) supports a crystal (12) with respect to a melt (14) by a plurality of flexible cables (41, 42 and 43). The supporting lengths of the cables are radially offset in a horizontal plane from a vertical central axis (29) about which the growing crystal (12) is rotated with respect to the melt (14). Because of their radially offset position, the cables have the capacity to oppose a torque which is typically generated by the relative rotation of the crystal with respect to the melt. The supporting cables (41, 42 and 43) also impart increased orientational stability to a lower support bracket (26) which holds the crystal (12) relative to the melt (14).

11 Claims, 4 Drawing Figures

FIG.-3
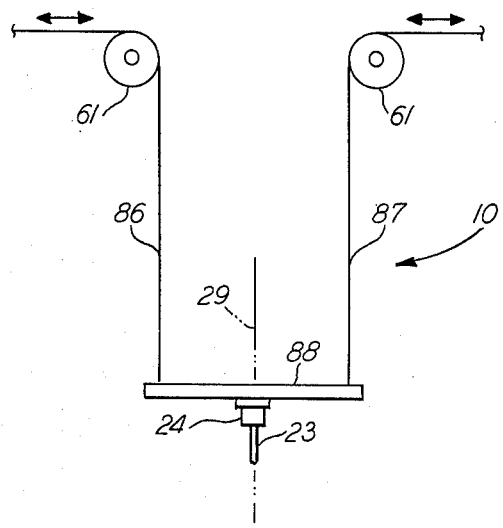
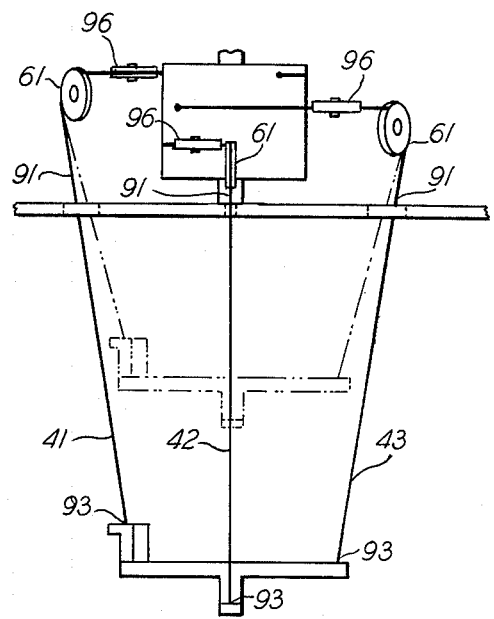
FIG.-4

CRYSTAL GROWER WITH TORQUE SUPPORTIVE COLLAPSIBLE PULLING MECHANISM

TECHNICAL FIELD

This invention relates to crystal growing apparatus, and particularly to Czochralski type crystal growing apparatus, wherein a single crystal grows at the end of a seed crystal upon being brought into contact with a melt contained in a crucible. As the crystal forms on the seed crystal near the surface of the melt, the already grown crystal is gradually pulled from the melt. Uniform characteristics within the crystal are obtained by rotating the crucible with the melt in one direction, while rotating the grown crystal in a direction opposite thereto. The diameter of the cross section of the growing crystal is typically controlled by the rate at which the crystal is pulled from the melt. The invention relates particularly to a mechanism for pulling the crystal from the melt.

BACKGROUND OF THE INVENTION

In typical crystal growing apparatus of the type wherein a crystal of substantially cylindrical shape is pulled from the melt, one typical pulling mechanism includes a rotatably mounted and vertically slideable pull rod, to the lower end of which a crystal seed is attached. During the process of growing the desired crystal, the rod is vertically translated at the desired rate at which the crystal is drawn from the melt. The disadvantage of such a rod-supported pulling mechanism is that a support structure for the mechanism rises to a height which includes the length of the pull rod, the mounting chuck for the crystal seed and the desired length of the crystal to be pulled from the melt. Because it is economical and practical to grow crystal cylinders or ingots of a length in excess of one meter, it becomes desirable to move the pull rod vertically through considerable distances. It is apparent that the length of a crystal grown by an apparatus of this type is likely to be limited by a reasonable limit on the height of the towering overhead structure of such crystal growing apparatus.

A relatively recent development in the crystal growing apparatus art uses an overhead pulling mechanism, wherein the crystal seed is attached to an end of what is referred to as a wire rope, and which is in essence a stranded, flexible cable. Under the weight of a seed holder and of the additional weight of the grown crystal, the cable remains in tension to support the growing crystal relative to the melt. In an upper portion of a growing chamber, the cable is reeled onto a drum, thereby eliminating the additional height in the structure of the chamber to house a rigid rod. The drum is mounted to revolve about the downward extended length of the cable as an axis such that the crystal can be rotated on a vertical axis with respect to the apparatus.

While such cable-supported pulling mechanism overcomes disadvantages which may be related to a solid rod pulling mechanism such that the cable-supported mechanism should therefore permit the growth of a relatively long crystal ingot, a disadvantageous tendency has been observed in some cable-supported crystal pulling mechanisms. A problem of oscillation tends to develop as the growing crystal is pulled from the melt by the crystal pulling mechanism, whereby the crystal starts to swing perpendicular to its axis of rotation and thereby away from a central axis of the apparatus. Such oscillation at times results in undesirably non-uniform growth of the crystal, and has already resulted in lateral oscillatory displacements of the crystal of such magnitude that the crystal growing process had to be terminated prematurely.

It is, therefore, desirable to support the growing crystal by a mechanism which does not require added space in a growing chamber for housing a rigid support rod in addition to the grown crystal, but which also does not tend to tolerate or to support oscillations of the grown crystal away from the intended longitudinal axis of rotation of the crystal.

SUMMARY OF THE INVENTION

In accordance with the invention a crystal growing apparatus includes a lower support bracket for dependently mounting a seed crystal relative to a crystalline melt. The bracket is vertically and rotatably supported by a plurality of flexible cables depending from an upper support structure. The cables are laterally offset from a vertical axis coinciding with a centerline on which the seed crystal is mounted and rotated with respect to the melt.

BRIEF DESCRIPTION OF THE DRAWING

The following detailed description of the invention and of a preferred embodiment thereof will be best understood when read in reference to the accompanying drawing, wherein:

FIG. 3 is a simplified representation of an alternate embodiment of portions of the crystal pulling apparatus of FIG. 1 wherein a plurality of cables comprise two cables; and FIG. 4 is a schematic representation of another alternate embodiment of a crystal growing apparatus in accordance with this invention, wherein the mechanism is shown in a lowered position, and, in phantom lines, in an alternate, raised position.

DETAILED DESCRIPTION

General Operational Considerations

Czochralski-type crystal growing apparatus is a generally accepted type of apparatus for growing the bulk of single-crystal materials which are needed in the semiconductor industry. The invention is therefore described in reference to an apparatus which would typically be used for growing semiconductive silicon crystal ingots. However, from the further description of various features of the invention it will be understood that the invention is not limited to be used in relationship to any one particular material, but that it is, instead, applicable to operations on other materials which are similarly drawn from or past a work station.

Figure 1:
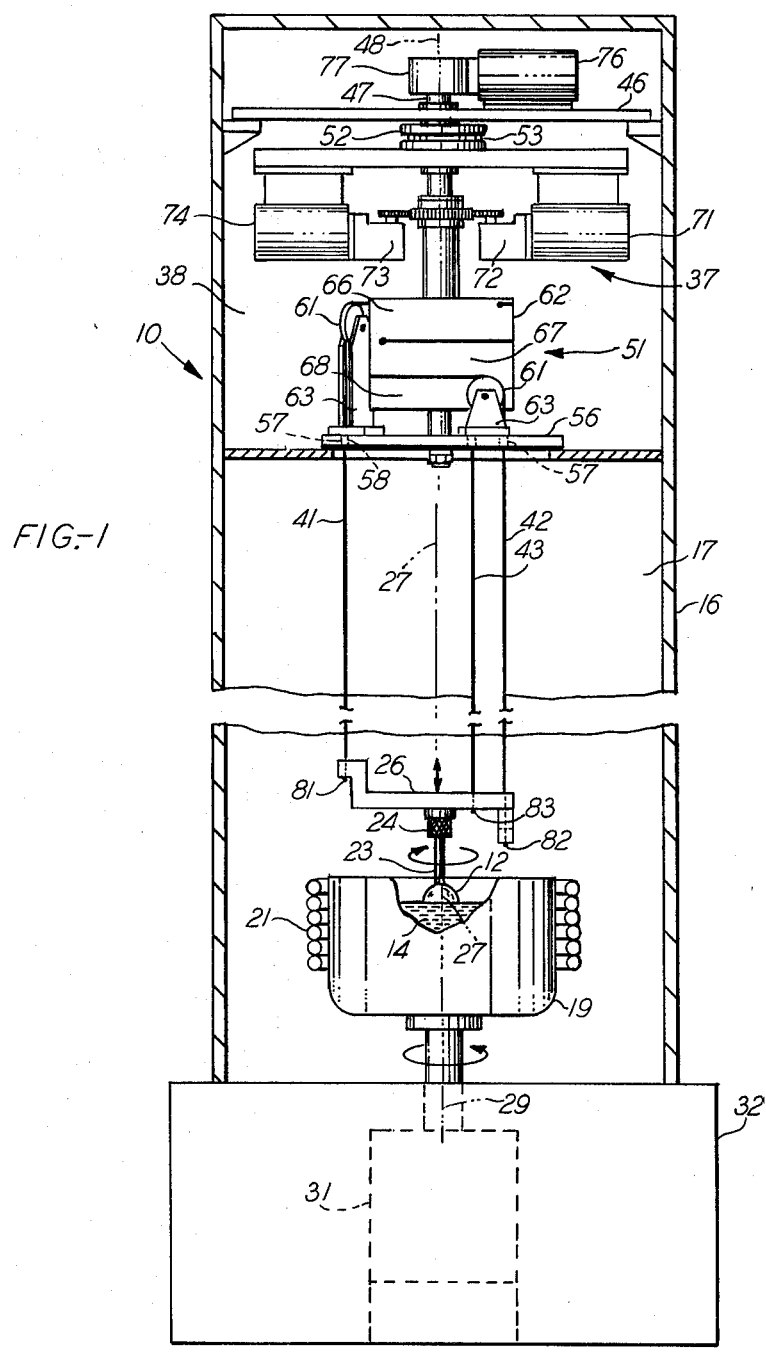
FIG. 1 is a simplified elevational, partially sectioned view of a crystal growing apparatus including a crystal pulling mechanism, which is an embodiment of the present invention.

FIG. 1 shows a Czochralski-type crystal growing apparatus, designated generally by the numeral 10, which by its particular structural features and mode of drawing a crystal 12 from a melt 14, represents an embodiment of the present invention. The apparatus 10 is shown in a somewhat simplified manner, with partially cut-away portions for a better understanding of the special features of the apparatus 10 relative to the overall operation thereof.

An outer housing 16 of the crystal growing apparatus 10 typically provides a sealed environmental chamber 17. In a lower portion 18 of the chamber 17, a charge of typically silicon material is contained in a molten state in a crucible 19. Heater elements 21 first generate the melt 14 from such charge and then continue to supply heat at a reduced rate to maintain a temperature at the melting point of the material and cause the crystal 12 to grow at the end of a seed 23. The seed 23 is mounted in a chuck 24 of a lower support bracket 26 and brought into contact with the melt 14 in the center of the crucible 19.

Of course, as the crystal 12 is grown from the melt 14, the original seed 23 of the crystal 12 appears to be an integral appendix at the upper end of the crystal 12. As the crystal 12 continues to form at or adjacent to the surface of the melt 14, the already grown crystal 12 is gradually pulled from the melt 14. The diameter of the crystal 12 is controlled by the rate at which the crystal is pulled from the melt 14.

Typically, a known concentration of doping impurities are added to the charge which forms the melt 14. Also, oxygen is typically liberated from the heated crucible 19 which is typically of quartz (silicon dioxide) from which a certain amount of material goes into solution with the melt. A problem in successfully growing crystal cylinders for further processing to manufacture electronic semiconductor devices resides in uniformly dispersing such dopants and other unavoidable impurities, such as oxygen, throughout the formed cylindrical crystal 12. A uniformly doped crystal usually simplifies further processing steps and results in improved yields of finished devices in comparison with the processing of less uniformly doped crystals as starting materials.

To achieve uniform crystal growth and dopant dispersion throughout the grown crystal, the grown crystal is typically rotated about its longitudinal axis 27 relative to the melt. Also, to maintain more uniform temperature gradients in the melt and more uniform melt conditions in general, the crucible 19 containing the melt 14 is typically rotated about a central axis 29 of the apparatus 10 and in a direction opposite to the rotational direction of the crystal. Such rotation is typically achieved by a drive mechanism 31 located in a base 32 of the housing 16, such mechanism 31 rotating through a centrally mounted vertical shaft 33 a pedestal 34 which supports the crucible 19.

The Crystal Pulling Mechanism

As the crystal 12 grows downwardly and outwardly below the surface of the melt 14, the lower support bracket 26 from which the crystal 12 depends into the melt 14 is gradually raised by a crystal pulling mechanism, which is designated generally by the numeral 37. The crystal pulling mechanism 37 is mounted relative to the apparatus 10 within an upper portion 38 of the chamber 17 and is thereby subject to the controlled atmosphere within the chamber 17.

A plurality of wire ropes or flexible cables 41, 42 and 43, depend from the mechanism 37 into the chamber 17. The downwardly depending length of each of the cables 41, 42 and 43, and its respective orientation within the chamber 17 are controlled by the operation of the mechanism 37. A lower end of each of the cables 41, 42 and 43 is attached to the bracket 26. Thus, under the weight of the bracket 26 and that of the growing crystal 12, the cables 41, 42 and 43 are taut and are capable of precisely determining each momentary position and orientation of the bracket 26, and thereby the crystal 12 with respect to the melt 14. Because of the proximity of the cables 41, 42 and 43 to the heat from the heater elements 21 and the melt 14, the cables are preferably of a heat resistant stainless alloy similar to or of the same material of cables used in single-cable crystal pulling mechanisms.

Figure 2:
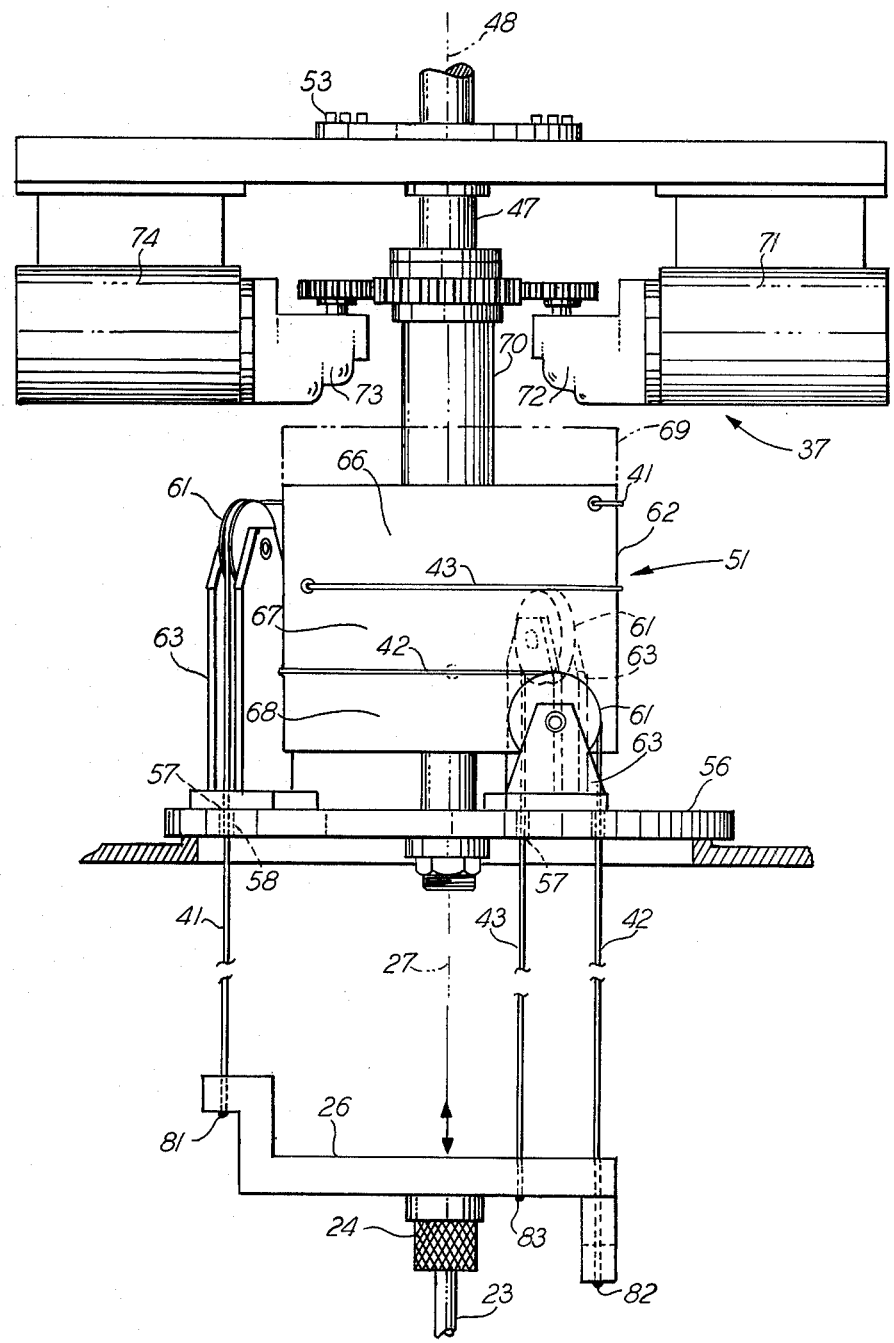
FIG. 2 is an enlarged view of the crystal pulling mechanism of the apparatus in FIG. 1.

An exemplary embodiment of the mechanism 37 shown in FIG. 1 is also shown in greater detail in FIG. 2. The mechanism 37 is preferably located in the upper portion 38 but still within the chamber 17. A frame member 46 fixedly mounts the mechanism 37 to the housing 16. Rotatably held in the frame member 46 is a vertical shaft 47. The longitudinal axis 48 of the shaft 47 (see FIG. 2) coincides with the central axis 29 through the apparatus 10. A cable reeling assembly 51 is fixedly mounted to the shaft 47. Electrical power and necessary control signals are transferred between the frame member 46 and the assembly 51 through typically mounted slip rings 52 with corresponding brush contacts 53.

The crystal pulling mechanism 37 is preferably isolated from the greater part of the chamber 17 by a dust and particle shield 56. The shield 56 protects the melt and hence the growing crystal 12 from contamination by wear particles and dust, which may be generated by the mechanism 37. The shield further protects most mechanical components of the mechanism 37 from excessive heat which may otherwise harm such mechanical components of the mechanism 37 and cause additional wear. Openings 57 through the shield 56 which correspond in number to that of the depending cables provide passages for the cables 41, 42 and 43 to extend between the mechanism 37 and the lower support bracket 26. A seal or gasket 58 of a comparatively non-abrasive or inert material such as silicon may be provided within the openings 57 to further prevent such dust to have access to the lower portion of the chamber 17.

During a crystal growing operation, the mechanism 37 remains activated in a controlled manner to gradually lift the growing crystal 12. With the lower support bracket 26 being supported by a plurality of cables, it becomes necessary to reel up each of the cables at a rate which ideally corresponds precisely to the reeling rate on the other cables. Thus, in the described embodiment, wherein the lower support bracket 26 is supported by three cables 41, 42 and 43, as it is shown in FIG. 1, if one of the cables were to be reeled at a rate different from that of the others, the lower support bracket 26 would become tilted from its horizontal orientation. The position of the crystal 12 relative to the center of the melt would thereby be disturbed and an orderly crystal growth would most likely be interrupted.

The crystal pulling mechanism 37 guides each of the cables 41, 42 and 43 over direction-changing pulleys 61 toward a common reeling drum 62. The drum 62 has a precision-machined cylindrical outer diameter. Each of the pulleys 61 being mounted to supports 63 of different heights is vertically spaced by a predetermined increment from one adjacent pulley 61, such that each of the cables 41, 42 and 43 are reeled onto respective, vertically offset peripheral portions 66, 67 and 68 of the drum 62. As the cables 41, 42 and 43 wind onto the drum 62, the drum shifts vertically with respect to the shaft 47 toward an upper position 69 shown in phantom lines in FIG. 2, guided by a conventional helical thread (not shown) which is mounted to the shaft 47. A drive sleeve 70 is vertically keyed with the drum 62 to support such a sliding motion of the drum with respect to the sleeve.

The reeling motion of the drum 62 about the shaft 47 is normally controlled by a first motor 71 through a first gear drive 72, which preferably includes typical speed reducing gears, such as a worm gear drive, because of a desirably slow vertical pulling motion during the crystal growing operation. To reset the lower mounting bracket 26 after a crystal growing operation, a second, faster reeling or unreeling speed of the drum 62 may be desired. Such a motion may be accomplished readily by disengaging the first gear drive 72 and engaging a second gear drive 73 having a different gear ratio. Such a speed change is conveniently accomplished in a conventional manner wherein the second gear drive is driven by a second motor 74 and typical electromagnetic clutches are included as components of the first and second gear drives 72 and 73 to alternatively engage the first motor 71 or the second motor 74 to drive the drum 62. However, a speed change for reeling and unreeling the cables 41, 42 and 43 may also be accomplished by different means. It is, for example, possible to provide only one motor common to both drives 72 and 73 for such speed change and to engage selectively either the one drive or the other by such clutches.

It is further to be noted that the operation of the first motor 71 through the first gear drive 72 is variably controlled either manually by an operator from a typical control module or by otherwise generated control signals. A typical control module as those of conventional crystal growing apparatus is not shown herein.

The entire crystal pulling mechanism 37 including the shield 56, the depending cables 41, 42 and 43 and the lower support bracket 26 revolve about the shaft 47. To generate and to control such revolving motion, the shaft 47 is rotatably driven by a third motor 76 through a third gear drive or gear train 77 which are both mounted to the frame member 46. As can be seen from FIG. 1 or FIG. 2, for example, the cables 41, 42 and 43 are laterally offset from the axis of rotation 48 of the shaft 47. From such offset position of the cables, a distinct advantage is derived. The cables 41, 42 and 43 in being laterally offset from the axis of rotation of the shaft 47 function in conjunction with the cable reeling assembly 51 including the pulleys 61 with their respective supports 63 as an upper support structure and the lower support bracket 26 as a unitary structure. Such unitary structure has the capacity to oppose without rotational flexing a torque which develops through a typical viscous interaction between the melt 14 and the growing crystal 12.

The lack of such capacity to resist a torque related to the viscosity of the melt as it may be exhibited in a crystal growing apparatus wherein the growing crystal is supported by a single stranded cable the position of which coincides with the axis of rotation, may result in a tortional reorientation of the lower support bracket or crystal holder with respect to the upper crystal pulling mechanism. In contrast to such single cable support of the crystal, the apparatus 10 provides, in essence, a precisely defined rotational motion of the lower support bracket 26 with respect to the melt 14. The overall rigidity of the suspension and control of the crystal 12 by the mechanism 37 is believed to virtually eliminate a tendency for the growing crystal 12 to oscillate with respect to the central axis 29 through the apparatus 10 as had been experienced in some prior art apparatus of the type wherein the crystal is supported by a single cable.

To further avoid changes in the horizontal orientation of the lower support bracket 26 caused by temperature induced changes in lengths of the cables 41, 42 and 43, mounting surfaces 81, 82 and 83 for the cables 41, 42 and 43 are vertically offset by a distance which corresponds to the vertical offset of the cables on the surface of the drum 62. Thus, the unreeled, extended supporting lengths of the cables 41, 42 and 43 between the upper support structure and the lower support bracket 26 are equal.

Alternate Embodiments

Various changes and modifications are possible without sacrificing the above-described features or advantages of the invention. For example, it is possible to support the lower support bracket 26 by only two cables and yet obtain a twist-resisting assembly, even if only one of the cables is offset from the central axis 29 of the apparatus 10. In such structure, however, the weight of the crystal 12 would be supported primarily by the cable which is closest to the central axis 29. The second cable consequently would be under less tension and differences in the tension could be compensated for by differences in the diameters of the respective cables, lest differences in the reeling speed of the respective cables could result. Such eccentric design difficulties may be avoided by a symmetrical structure wherein each of two supporting cables are diametrically opposed across from the central axis 29 of the apparatus 10.

Such a symmetrical, dual cable support is shown in FIG. 3, where cables 86 and 87 are shown equi-distant from the central axis 29 of the apparatus 10, and the resulting tension on each of the cables 86 and 87 due to the weight a correspondingly modified lower support bracket 88 and of the crystal 12 is substantially equal. However, a structural stability as exists in the structure of the triple cable suspension would be lacking in a dual cable suspension structure. Such a dual cable suspension is, therefore, a less preferred structure.

It is also possible to suspend the lower support bracket 26 by a plurality of cables greater than the three cables 41, 42 and 43 of the embodiment shown in FIG. 1. However, in modifying the number of cables to a number greater than three, it may become desirable to make special provisions for assuring for distributing the weight of the respective crystal holder or support bracket 26 including that of the grown crystal among the various cables. Depending on the number of cables which are employed to support the lower support bracket 26 and hence the crystal 12, the gauge or diameter of the cables may be varied such that the stress to which the cables are subjected remains within reasonable ranges. For example, corresponding to supporting a crystal by a single cable which is about 1.5 mm in diameter, a three-cable support may employ cables which are slightly less in diameter, such as 1 mm or 1.2 mm. In selecting the proper cable size, the intended size of the crystal to be grown has to be taken into account however.

FIG. 4 schematically illustrates an embodiment wherein the supporting cables 41, 42 and 43 are non-parallel to each other. In FIG. 4, the pulleys 61 guide upper depending cable portions 91 downward from a radial distance away from the centerline of the apparatus greater than the radial distance at which the lowermost ends 93 of the cables 41, 42 and 43 are attached to the lower support bracket 26. Hence, as the third motor rotates the mechanism 37 about the central axis 29 of the apparatus 10, the depending cable portions generate with their revolving motion essentially the surface shape of a truncated pyramid.

While in this latter described embodiment, the rigidity of the cable-suspended structure is further increased, minor disadvantages over the previously described structures are encountered. One of such disadvantages relates to a tangential orientation with respect to the drum 62 of the pulleys 61 in the embodiment of FIG. 1. When the depending cables are located in a symmetrical but non-parallel orientation about the central axis 29, their orientation in a plan view is radial. Thus, as shown in the schematic view of FIG. 4, each of the cables 41, 42 or 43 are preferably guided by an additional guide pulley 96 or in the alternative by a similarly oriented guide block to permit the combination of the two pulleys 61 and 96 to change the orientation from the substantially horizontal orientation on the drum to the radially directed orientation of the depending cables.

Also, as shown in the alternate, raised position of the lower support bracket 26, in phantom lines in FIG. 4, the angle of the supporting cable portions 91 changes as the crystal 12 is raised. Thus, if the speed at which the cables 41, 42 and 43 are wound onto the drum 62 remained constant, the speed at which the crystal is pulled from the melt would change according to a change in the cosine of the angle at which the cables are oriented with respect to the axis 29. However, a compensating factor to reflect this everchanging relationship may be included into a corresponding motor control circuitry (not shown) if an automated crystal pulling operation is desired. Another change in the embodiment of FIG. 4 portrays a necessary slotting of the openings 57 in the shield 56 to accommodate a changing position of the cables 41, 42 and 43 with respect to the shield 56, as the vertical position of the lower support bracket 26 changes.

It is to be understood that the described embodiments are for illustrative purposes only and are not intended to suggest that other equivalent structures or components may not be used within the spirit and scope of this invention. For instance, it is within the scope of this invention to substitute other known flexible support members for the described cables as, for example, a bead chain. In view of the foregoing, it will be understood that in reading and understanding the detailed description, the term "cable" should be taken to include both single stranded or multi-stranded members, as well as bead chains, link chains and other equivalents.

Various other changes and modifications are, of course, possible without departing from the spirit and scope of this invention.

What is claimed is:

1. Apparatus for growing crystals, which comprises: means for mounting a crystal;
   at least two flexible cables for supporting said crystal mounting means such that the crystal is in coinciding alignment with a predetermined axis of said apparatus, at least one of said at least two flexible cables being in non-coincident relationship with such axis of said apparatus whereby said at least one cable, non-coincident with such axis supports a counter-torque about such axis to oppose rotational motion of such crystal about such axis as a result of a torque generated on the crystal; and
   means for simultaneously winding said at least two cables to vertically translate said crystal mounting means within said apparatus.

2. Apparatus according to claim 1, wherein at least two flexible cables comprises at least three flexible cables each one of which is offset from said axis on which said crystal is centered.

3. Apparatus according to claim 2, wherein the apparatus further comprises a crucible for retaining a melt or a quantity of material in a liquid state for forming further crystalline material on a surface of such crystal, said at least three flexible cables supporting said crystal in a vertical position in contact with a melt within said crucible, and means for generating relative motion between the crystal and the melt about said predetermined axis of the apparatus, whereby a torque is generated on the crystal.

4. Apparatus according to claim 3, wherein the means for generating relative motion comprises means for revolving said at least three cables about said predetermined axis of the apparatus.

5. Apparatus for growing a crystal ingot, which comprises:
   a vertical growing chamber;
   a crucible for retaining a melt mounted in a lower portion of the chamber;
   a lower support bracket including a chuck for holding a seed crystal;
   at least three flexible cables vertically translatably suspended from an upper portion of the chamber, lower ends of said cables being attached to said lower support bracket to position said lower support bracket such that said seed crystal is located on a predetermined vertical axis of the apparatus and said cables are radially offset from said predetermined axis of the apparatus;
   means mounted in the upper portion of said chamber for vertically translating said cables for translating said seed crystal along said predetermined vertical axis toward and away from said melt, whereby the seed crystal may be brought into contact with the melt to permit a crystal to grow on a free, depending end of the seed crystal and the grown crystal may be raised from the melt as the crystal continues to grow; and
   means for rotating said vertical translating means about said predetermined vertical axis of the apparatus such that said cables revolve about said predetermined vertical axis and oppose a torque generated on said growing crystal in response to a viscous friction between the melt and the crystal, as the crystal is rotated about said axis with respect to said melt.

6. Apparatus for growing a crystal ingot according to claim 5, wherein said vertical translating means comprises means for winding each of said cables at the same rate to translate said lower support bracket vertically along said predetermined axis.

7. Apparatus for growing a crystal ingot according to claim 6, wherein said means for winding said cables comprises a rotatably mounted, single drum, and at least one pulley associated with each of said at least three cables to support such depending length of such cable and to redirect such cable tangentially to the surface of said drum.

8. Apparatus for growing a crystal ingot according to claim 7, wherein said drum of said means for winding said cables is mounted on said predetermined vertical axis and each of said at least three cables is wound onto a designated, vertically offset portion of the surface of the drum, said pulleys associated with each of such cables being similarly vertically offset to guide the respective cables onto their designated portions of the drum.

9. Apparatus for growing a crystal ingot according to claim 8, wherein the lower support bracket has vertically offset surfaces for attaching said at least three cables and the vertical dimensions between such offset surfaces correspond to those of the vertical offsets on the drum, such that the depending length of each of such cables between the corresponding pulley and said bracket is equal to the depending length of each of the other cables.

10. Apparatus for growing a crystal ingot according to claim 9, wherein the depending lengths of the cables between their respective pulleys and their attachment to the lower support bracket are non-parallel to each other.

11. Apparatus for growing a crystal ingot according to claim 10, wherein the radial offset of the depending cables from the predetermined vertical axis in a horizontal plane is greater in the upper portion of the chamber than at the lower support bracket, such that as the cables revolve about said predetermined vertical axis, they generate the surface shape of a truncated pyramid.

* * * * *